United States Patent [19]

Sharpe-Geisler

[11] Patent Number: 5,491,433
[45] Date of Patent: Feb. 13, 1996

[54] CASCODE ARRAY CELL PARTITIONING FOR A SENSE AMPLIFIER OF A PROGRAMMABLE LOGIC DEVICE

[75] Inventor: Bradley A. Sharpe-Geisler, San Jose, Calif.

[73] Assignee: Advanced Micro Devices, Inc., Sunnyvale, Calif.

[21] Appl. No.: 444,306

[22] Filed: May 18, 1995

Related U.S. Application Data

[62] Division of Ser. No. 34,537, Mar. 19, 1993.

[51] Int. Cl.[6] .................................. H03K 3/037
[52] U.S. Cl. .................... 326/39; 326/44; 327/51; 365/189.08
[58] Field of Search ............... 326/37, 39, 40, 326/44; 327/51, 54, 57; 365/189.08, 189.01, 205

[56] References Cited

U.S. PATENT DOCUMENTS

| | | | |
|---|---|---|---|
| 4,845,681 | 7/1989 | Vu et al. ............................ | 326/115 |
| 4,864,168 | 9/1989 | Hoberman et al. ................. | 326/16 |
| 5,013,943 | 5/1991 | Hirose ................................ | 365/203 X |
| 5,027,008 | 6/1991 | Runalde ............................. | 327/54 |
| 5,056,063 | 10/1991 | Santin et al. ..................... | 365/208 |
| 5,189,322 | 2/1993 | Chan et al. ....................... | 326/30 |
| 5,297,093 | 7/1994 | Coffman ............................. | 307/530 |
| 5,345,419 | 9/1994 | Fenstermaker et al. .......... | 365/221 X |
| 5,355,333 | 10/1994 | Pascucci .......................... | 365/189.01 |
| 5,410,268 | 4/1995 | Sharpe-Geisler ................. | 327/77 X |

*Primary Examiner*—David R. Hudspeth
*Attorney, Agent, or Firm*—Fliesler, Dubb, Meyer & lovejoy

[57] ABSTRACT

A sense amplifier for implementing a wide or multiple input NOR gate for receiving a product term of a group of array cells in a programable logic device (PLD). Array cells signals which are all normally received by the sense amplifier in a single product term input are instead connected to the sense amplifier in smaller groups of sub-product terms. Each smaller group of sub-product terms is then connected through a transistor cascode amplifier in the sense amplifier to form the single product term enabling a reduction of capacitance and an increase of output speed of the sense amplifier.

3 Claims, 4 Drawing Sheets

✦ INDICATES PROGRAMMABLE CELL

CASCODE ARRAY CELL PARTITIONING FOR A SENSE AMPLIFIER OF A PROGRAMMABLE LOGIC DEVICE

This application is a divisional application of Ser. No. 08/034,537, filed Mar. 19, 1993, which is currently pending.

BACKGROUND OF THE INVENTION

1. Field of the Invention

The present invention relates to sense amplifiers used in a programmable logic device (PLD) to implement wide or multiple input NOR gates which operate at high speeds. More particularly, the present invention relates to the product term, or connection, of array cells in the PLD to the sense amplifiers.

2. Description of the Related Art

FIG. 1 shows an array structure for a typical prior art programmable array logic (PAL) device, a type of PLD. The PAL of FIG. 1 has six inputs $I_{0-5}$ and four outputs $O_{0-3}$. The PAL device further has an AND array 100 followed by a fixed OR array 102. An input such as $I_0$ to the PAL has a true output 104 and a complement output 106 forming rows connected to array cells 108 containing individual cells, such as 110. An array cell, such as cell 110, may be programmed to be connected or disconnected to an AND gate in the AND array 100. A group of array cells which may be connected to an AND gate as shown at 112 is called a product term.

Although connections from the array cells 108 to the fixed OR array 102 are shown as fixed, they may be programmable. Additional programmable features may also be added, such an output macro cell 114 which is programmable to allow an output to be either registered or combinatorial. The output macro cell 114 is utilized on the AmPALCE22V10 manufactured by Advanced Micro Devices, Inc.

Although shown as an AND array 100, in reality the AND array 100 has AND gates implemented using NOR gates with true and complement row connections to array cells 108 reversed internally.

To implement a multiple input NOR gate, also termed a wide NOR gate, and provide sufficient output voltage to the OR gate array 102, manufacturers utilize sense amplifiers. Sense amplifiers convert a small voltage change from the product term into a larger, rail to rail, voltage to supply to an OR gate at high speed.

FIG. 2 shows a prior art sense amplifier 200 connected to receive a single product term from array cells 202 in a PLD. This sense amplifier configuration was utilized in the AmPALCE16V8 manufactured by Advanced Micro Devices, Inc. to implement a wide NOR gate.

As shown in FIG. 2, array cells 202 receive input signals from rows 1–3 and are connected to form a product term (PT) line connection to sense amplifier 200. Further, the array cells have ground lines connected to form a product term ground (PTG) line connection to sense amplifier 200.

In operation, the PT line will be high if all of the cells are off, or not conducting. The PT line will be low if one or more cells are on, or conducting. A cell will conduct if it is programmed and if its associated row line is high.

The sense amplifier 200 includes an amplifier 204 consisting of two inverters, a first inverter including transistors 206 and 208, and a second inverter including transistors 210 and 212. A voltage clamp consisting of transistors 214 and 216 provides feedback from the input of the second inverter to the input of the first inverter. The input of the amplifier is connected to the PT line of the array cells 202. The circles on transistors, such as 206, 210 and 216, indicate a P-type transistor, while no circle on a transistor indicates an N-type transistor.

The sense amplifier 200 additionally includes a current source transistor 218 controlled by a voltage reference VBSPRP to supply current at the PT line connection to the amplifier input. A PTG current sink transistor 220 controlled by a voltage reference VSARF1 is connected to the PTG line connection to the array cells 202.

In operation, when all cells are off, the current source 218 with current limited by reference voltage VBSPRF will provide current to pull the PT line up until node 250 is driven sufficiently low so that current sunk by clamp transistor 216 just balances the current sourced by current source 218. A low at node 250 will result in a high at SAOUT by means of inverter 210, 212.

The clamp 214, 216 is provided since the PT line has a high capacitance due to the number of cells connected to it. With the high capacitance of the PT line, by limiting the voltage swing to small displacements around the threshold of the amplifier utilizing a clamp 214, 216 higher speeds are provided.

When one or more cells turn on, the PT line will be pulled low. The PTG current sink transistor 220 will then function as a current sink. Reference voltage VSARF1 is a current limiting voltage such that current sink transistor 220 can sink more current than sourced by current source transistor 218. Clamping is provided during turn on so that the PT line voltage will drop until node 250 is sufficiently high that clamp transistor 214 will source just enough current to balance the excess sink capacity of current sink transistor 220. Again, clamping limits the voltage swing to small displacements around the threshold of the amplifier to provide higher output switching speeds.

With the sense amplifier 200 of FIG. 2, performance is limited by the effectiveness of the clamp 214, 216 to limit the voltage swing of the PT line, as well as the slew-rate of the PT line. The slew-rate of the PT line is proportional to the non-equilibrium current driving the product term and inversely proportional to the capacitance of the PT line.

SUMMARY OF THE INVENTION

The present invention reduces the effective capacitance of the product term of a group of array cells while allowing higher operation speed of the sense amplifier and utilization of less power.

The present invention is a sense amplifier for implementing a wide NOR gate connected to array cells in small groups of sub-product terms, rather than a single product term as shown in FIG. 2. Each small group of sub-product terms is then connected through an input cascode transistor amplifier in the sense amplifier to form the single product term enabling a reduction of capacitance and an increase of output speed of the sense amplifier.

In one embodiment, the sense amplifier of the present invention further includes two current sink transistors coupled by switching transistors to sink current from the input cascodes and enable a faster switching speed. The switching transistors have gates connected to a feedback from the sense amplifier output so that the current sink transistors will be on prior to a cell switching on to provide an additional current sink to the PTG current sink when the cell turns on, while the additional current sinks will be switched off shortly thereafter allowing a current source to pull up the sense amplifier output when the cell turns off.

In another embodiment, the sense amplifier of the present invention utilizes two current sink cascode transistors controlled to be on prior to a cell switching on to sink additional current from the input cascodes when the cell turns on to enable a faster switching speed.

The present invention additionally utilizes a shunt current sink transistor coupled in parallel with the PTG current sink transistor and a shunt current source transistor coupled with a current source transistor of the sense amplifier to increase switching speed. The shunt current sink and source transistors have gates connected to a feedback from the output of the sense amplifier. With the feedback, the shunt current sink transistor will be switched on when a cell is turning on. The shunt current source transistor will be switched off when a cell is turning on.

The present invention additionally utilizes buffers in feedback paths from the sense amplifier output to reduce capacitive loading.

BRIEF DESCRIPTION OF THE DRAWINGS

Further details of the present invention are explained with the help of the attached drawings in which.

DESCRIPTION OF THE PREFERRED EMBODIMENTS

Figure 1:
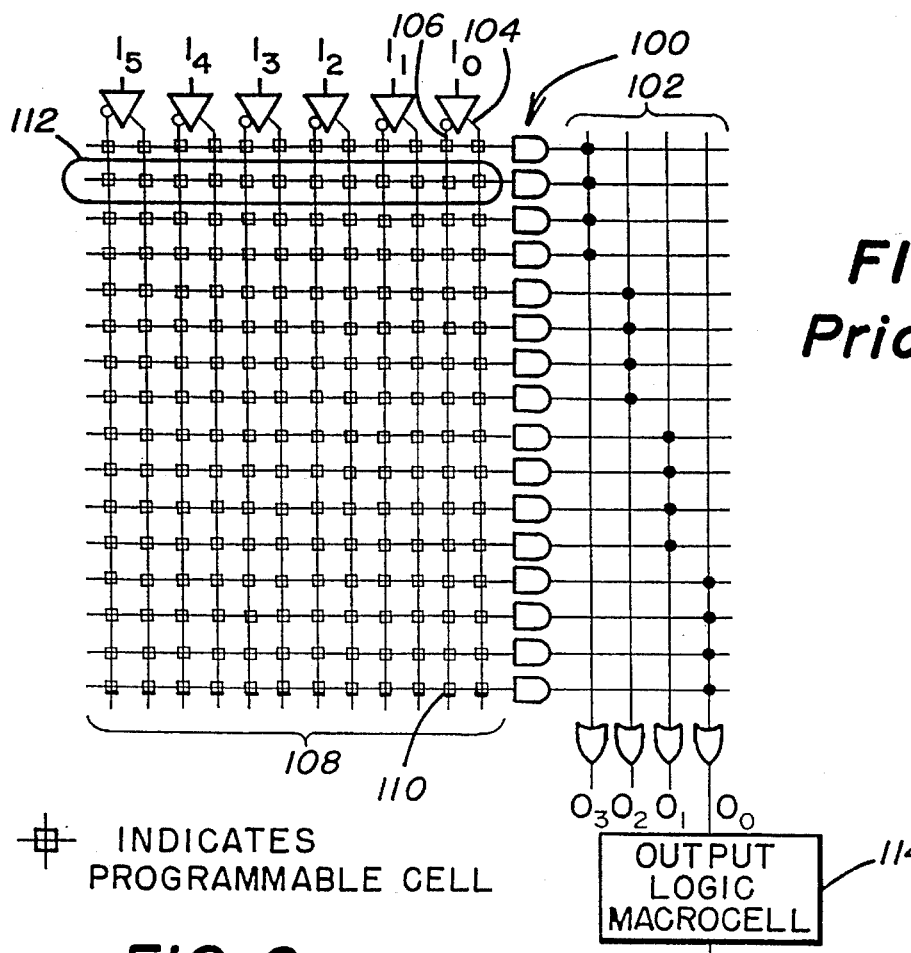
FIG. 1 shows an array structure for a typical prior art PAL.
Figure 2:
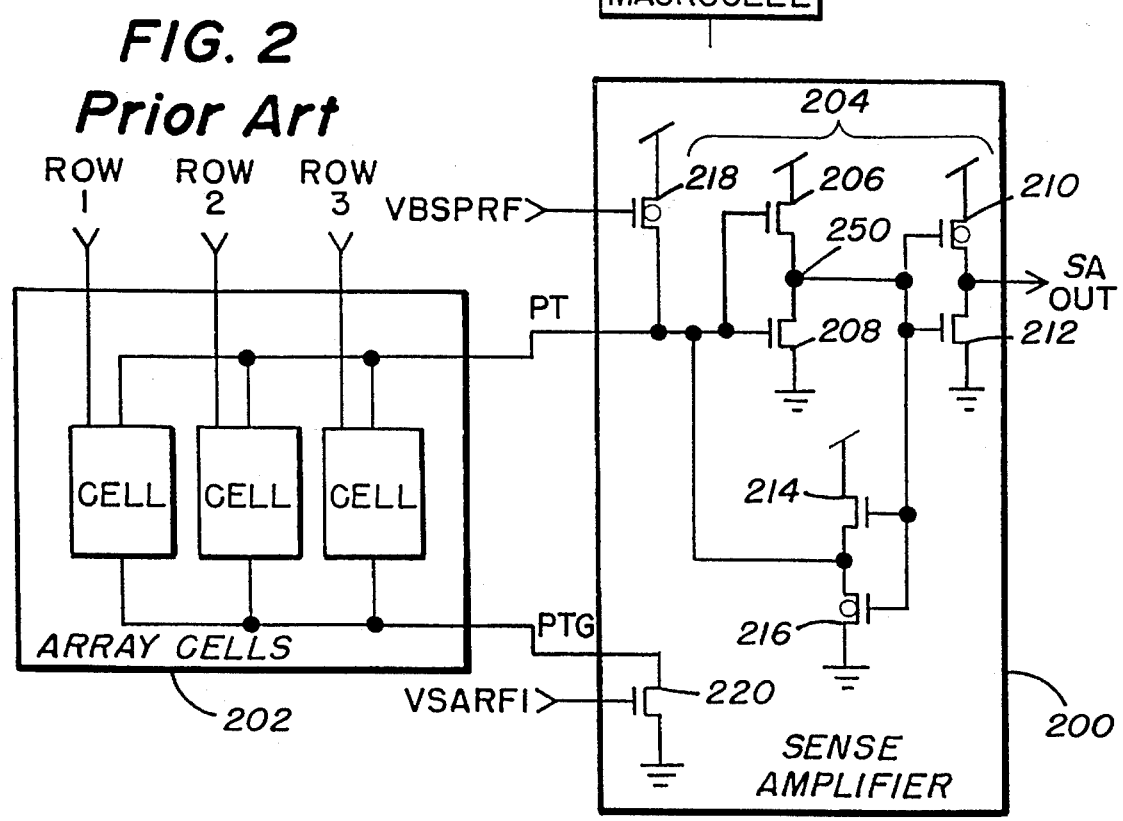
FIG. 2 shows a prior art sense amplifier connected to receive a single product term from array cells in a PLD.
Figure 3:
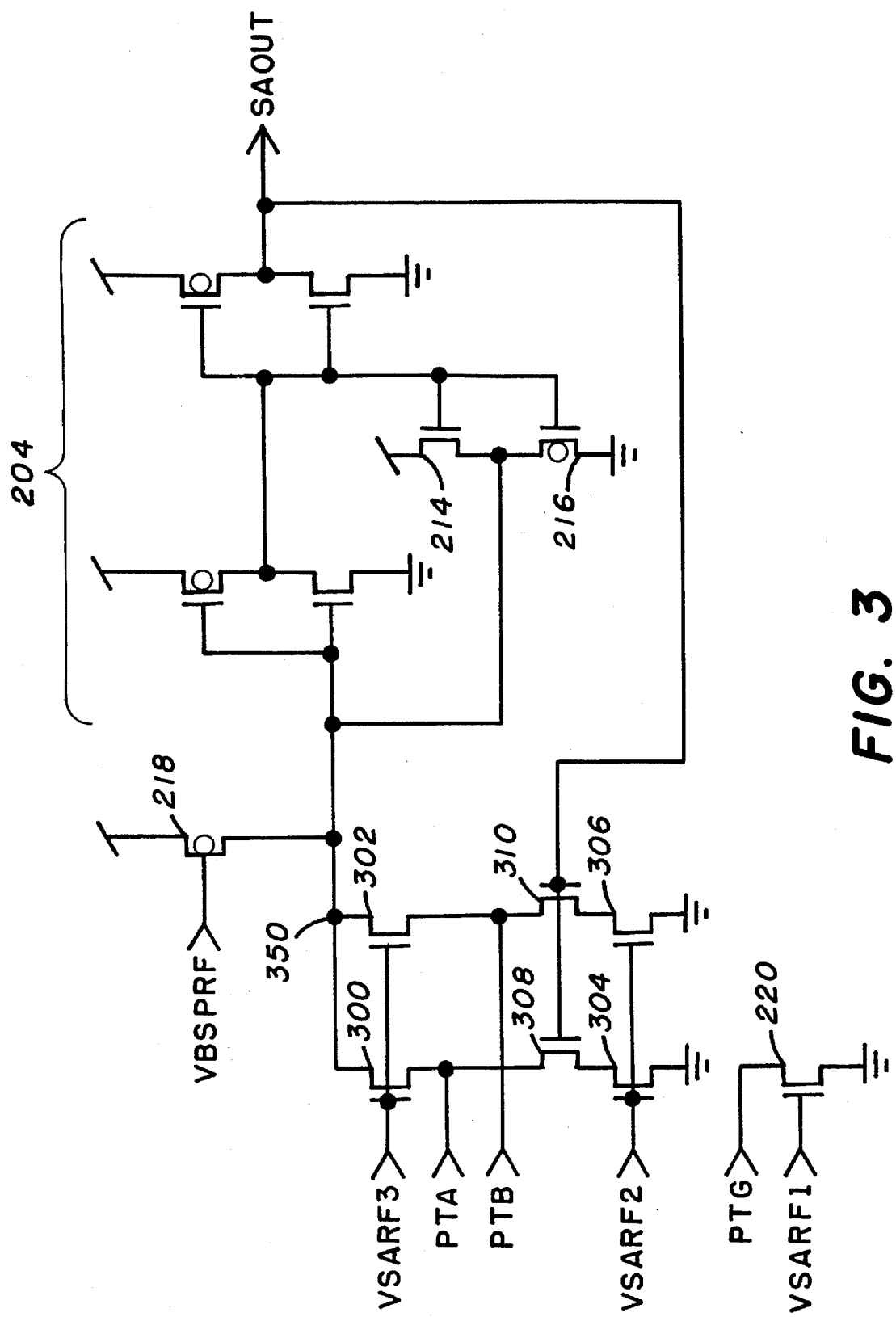
FIG. 3 shows an embodiment of a sense amplifier of the present invention.

FIG. 3 shows an embodiment of a sense amplifier of the present invention. As in FIG. 2, the sense amplifier of FIG. 3 includes an amplifier 204, a current source transistor 218 controlled by a voltage reference VBSPRF, and a current sink transistor 220 controlled by a voltage reference VSARF1 which is connected to the product term ground (PTG) line. For convenience, like reference numbers for components in the circuitry of FIG. 2 which are referenced in FIG. 3 are carried over.

The sense amplifier of FIG. 3 additionally includes product term connections to array cells which, rather than being connected to form one product term (PT) line connection as in FIG. 2, are connected to form two connections, a product term A (PTA) line connection and a product term B (PTB) line connection.

The sense amplifier of FIG. 3 further includes two transistors 300 and 302, functioning as cascodes, which have source connections to the PTA and PTB lines, respectively. Drains of transistors 300 and 302 are connected to the current source 218 and amplifier 204 input to form a node 350. Gates of transistors 300 and 302 are connected to a voltage reference VSARF3 which is set to turn off the cascode transistors 300 or 302 when a voltage on the PTA line or PTB line, respectively, is within a few tenths volts of the node 350.

A cascode transistor is a transistor defined by being turned on and off by varying voltage applied to the source with the gate voltage fixed, rather than varying the gate voltage. In a cascode transistor with $(v_g - v_s) > v_t$, wherein $v_g$ is the gate voltage, $v_s$ is the source voltage, and $v_t$ is the threshold voltage of the transistor, the cascode transistor will turn on. With $(v_g - v_s) < v_t$, the cascode transistor will turn off.

In operation, with cells divided equally between two sub-product terms PTA and PTB, the capacitance of each sub-product term will be roughly half that of a whole product term such as the PT line of FIG. 2. By setting the VSARF3 reference so that cascodes 300 and 302 turn off when either PTA or PTB, respectively, rise within a few tenths of a volt of node 350, the capacitance of the PTA line will be effectively isolated from the PTB line.

Cascodes 300 and 302 not only isolate capacitance, they also provide gain. Cascodes 300 and 302 are chosen such that with a voltage swing on the PTA line or PTB line will be amplified to a greater voltage swing at node 350 which will increase the effectiveness of the clamp 214, 216 to limit the voltage swing on the PTA and PTB lines. For a switching event on the PTA or PTB line, the slew-rate of node 350 will be roughly proportional to the reciprocal of half the total capacitance of the PTA and PTB lines times the gain of a cascode which is typically chosen to be from 2 to 4.

The sense amplifier of FIG. 3 further includes current sink transistors 304 and 306 coupled by switching transistors 308 and 310, respectively, to the PTA line and PTB line, respectively. Switching transistors 308 and 310 have gates connected by a feedback from the amplifier 204 output. Current sink transistors 304 and 306 have gates connected to a reference voltage VSARP2.

In operation, reference VSARP2 is set so that current sink transistors 304 and 306 sink less current than current source transistor 218 sources. In this manner, when no cells are on, node 350 will be high regardless of whether switching transistors 308 and 310 are on or not. When node 350 is high, SAOUT will be high. SAOUT being high guarantees switching transistors 308 and 310 are on. With transistors 308 and 310 on, the voltage at the PTA and PTB lines will drop until cascodes 300 or 302 turn on sufficiently to match the current sunk by transistors 304 and 306, respectively.

When a cell, for instance a cell connected to the PTA line, turns on, PTA will be pulled low, the cell will draw current to PTG current sink transistor 220 adding to the current drawn by current sink transistors 304 and 306. The drop in voltage of the PTA line will more strongly turn on cascode 300 which in turn pulls node 350 low. Because cascode 300 will be in saturation, the voltage drop of node 350 will be greater than the voltage drop of the PTA line. PTB will be unaffected because the drop in node 350 is insufficient to take cascode 302 out of saturation. Node 350 being low causes SAOUT to go low which turns off switching transistors 308 and 310. Because PTG current sink transistor 220 is a stronger current sink than current source transistor 218, node 350 remains low as long as the cell is on.

Figure 4:
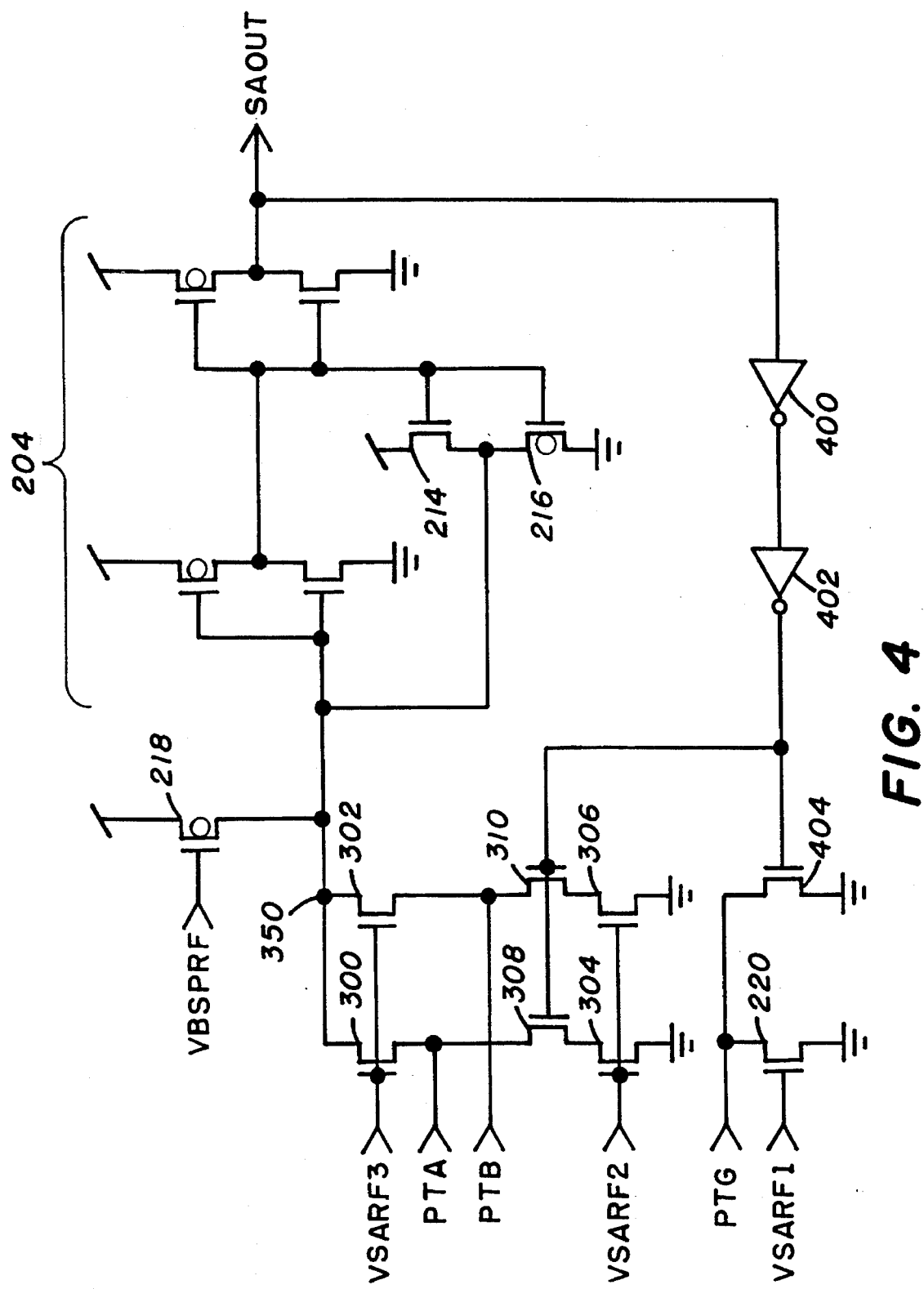
FIG. 4 shows the sense amplifier of FIG. 3 further utilizing a buffered feedback and a transistor shunting the PTG current sink during high to low transitions of the product term.

Pig. 4 shows the sense amplifier of FIG. 3 further utilizing buffers 400 and 402 in the feedback path from the SAOUT output of amplifier 204 to transistors 308 and 310. FIG. 4 further shows a current sink transistor 404 shunting the PTG current sink 220. The buffers 400 and 402 are also connected from SAOUT to the gate of current sink transistor 404. For convenience, like reference numbers for components in the circuitry of FIG. 3 which are referenced in FIG. 4 are carried over.

In operation, buffers 400 and 402 buffer the feedback to reduce capacitive loading on the output SAOUT of sense amplifier 204. Current sink transistor 404 is coupled to SAOUT to be on and shunt current sink transistor 220 during rapid high to low transitions of node 350, but turning off after node 350 has switched to low.

Figure 5:
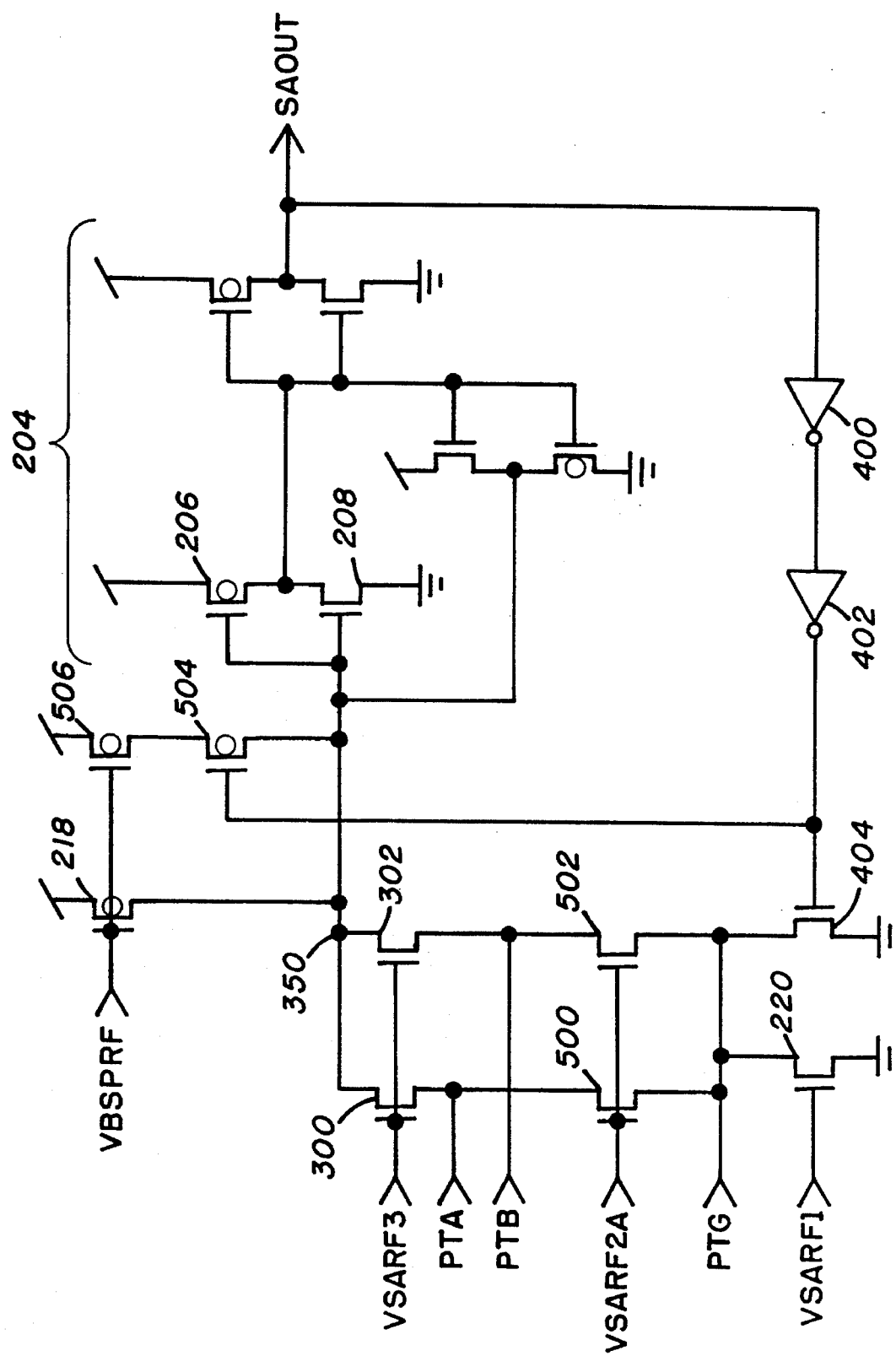
FIG. 5 shows an embodiment of a sense amplifier of the present invention with cascode transistors connecting the input cascode transistors directly to the PTG current sink during high to low transitions of the product term.

FIG. 5 shows another embodiment of a sense amplifier of the present invention. As in FIG. 2, the sense amplifier of FIG. 5 includes an amplifier 204, a current source transistor 218 controlled by a voltage reference VBSPRF, and a current sink transistor 220 controlled by a voltage reference VSARF1 which is connected to the product term ground (PTG) line.

As in FIG. 3, the sense amplifier of FIG. 5 includes product term connections to array cells including a product term A (PTA) line connection and a product term B (PTB) line connection. The PTA and PTB lines are connected to the source of cascode transistors 300 and 302, respectively. Gates of cascodes 300 and 302 are connected to a voltage reference VSARF3 which is set to turn off the cascode transistors 300 or 302 when a voltage on the PTA line or PTB line, respectively, is within a few tenths volts of a node 350.

Like FIG. 4, the sense amplifier of FIG. 5 further utilizes buffers 400 and 402 in the feedback path from SAOUT to a current sink transistor 404 shunting a PTG current sink 220. For convenience, like reference numbers for components in the circuitry of FIG. 5 which are referenced in previous figures are carried over.

FIG. 5 further includes cascode transistors 500 and 502 connecting the sources of input cascode transistors 300 and 302 directly to the PTG current sink transistor 220. Gates of cascodes 500 and 502 are connected to a voltage reference VSARP2A which is set to turn off the cascode transistors 500 or 502 when a rise in voltage on the PTG line occurs.

In operation with cascodes 500 and 502, when no cell is conducting, node 350 is high which results in parallel current sink transistor 404 being on. When transistor 404 is on, the PTG line will be at 0 volts so that with VSARF2A appropriately set, cascodes 500 and 502 will be on.

When a cell is conducting, node 350 will be low which will make SAOUT low which will turn off parallel current sink transistor 404. Because transistor 220 is now the only current sink, the PTG line voltage will rise to around 0.4 volts. With VSARF2A appropriately set, the rise in the PTG line voltage will turn cascodes 500 and 502 off.

Operation of the input cascode transistors 300 and 302 is similar to operation described with respect to FIG. 3.

FIG. 5 further includes a current source transistor 506 in series with switching transistor 504, transistors 504 and 506 being connected in parallel with current source 218. The gate of switching transistor 504 is further connected to the amplifier 204 output SAOUT through buffers 400 and 402.

In operation, with transistors 504 and 506, VBSPRF is set such that when node 350 is high transistor 218 is balanced above the threshold of inverter 206, 208. When node 350 is low, transistor 504 is turned on by SAOUT so that transistors 218 and 506 are balanced at below the threshold of inverter 206 and 208 by current sink transistor 220.

Although not shown in FIG. 3 or FIG. 4, transistors 504 and 506 connected in parallel with current source transistor 218 as shown in FIG. 5 may also be included in FIG. 3 or FIG. 4.

Although the invention has been described above with particularity, this was merely to teach one of ordinary skill in the art how to make and use the invention. Many modifications will fall within the scope of the invention, as that scope as defined by the following claims.

What is claimed is:

1. A programable array logic device comprising:

a plurality of programable array cells;

a sense amplifier comprising:
    an amplifier having an amplifier input and an amplifier output;
    a current source coupled to the amplifier input;
    a product term A line coupled to a first plurality of array cells in the plurality of array cells;
    a product term B line coupled to a second plurality of array cells in the plurality of array cells;
    a first cascode having a current path coupled on a first end to the current source and the amplifier input and coupled on a second end to the product term A line, wherein a gate of the first cascode is supplied with a gate voltage to turn off the first cascode when a voltage on the product term A line is within a predetermined voltage range from a voltage on the amplifier input; and
    a second cascode having a current path coupled on a first end to the current source and the amplifier input and coupled on a second end to the product term B line, wherein a gate of the second cascode is supplied with a gate voltage to turn off the first cascode when a voltage on the product term B line is within a predetermined voltage range from a voltage on the amplifier input; and
    an output logic macro cell coupled to receive an output signal from the sense amplifier, the output logic macro cell being programable to select whether an output of the programable logic device will be registered or combinatorial.

2. The programmable array logic device of claim 1 further comprising:

a first switching transistor having a gate coupled to the amplifier output and having a current path coupled on a first end to the product term A line;

a second switching transistor having a gate coupled to the amplifier output and having a current path coupled on a first end to the product term B line;

a first current sink coupled to a second end of the current path of the first switching transistor; and a second current sink coupled to a second end of the current path of the second switching transistor.

3. The programmable array logic device of claim 1 further comprising:

a PTG current sink coupled to ground lines of the plurality of array cells;

a third cascode having a current path coupled on one end to the product term A line, and on a second end to the PTG current sink; and a fourth cascode having a current path coupled on one end to the product term B line, and on a second end to the PTG current sink.

* * * * *